US009362000B2

(12) United States Patent
Takizawa et al.

(10) Patent No.: US 9,362,000 B2
(45) Date of Patent: Jun. 7, 2016

(54) MEMORY SYSTEM AND MANAGEMENT METHOD THEREOF (71) Applicant: Kabushiki Kaisha Toshiba, Minato-Ku, Tokyo (JP)

(72) Inventors: Kazutaka Takizawa, Kawasaki Kanagawa (JP); Masaaki Niijima, Machida Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/579,127

(22) Filed: Dec. 22, 2014

(65) Prior Publication Data

US 2016/0071612 A1   Mar. 10, 2016

Related U.S. Application Data

(60) Provisional application No. 62/046,535, filed on Sep. 5, 2014.

(51) Int. Cl.
*G11C 16/04* (2006.01)
*G11C 16/34* (2006.01)

(52) U.S. Cl.
CPC .... *G11C 16/3495* (2013.01); *G06F 2212/1032* (2013.01); *G06F 2212/7211* (2013.01)

(58) Field of Classification Search
CPC ................ G06F 2212/403; G06F 2212/7211; G06F 11/1048; G06F 2212/1032; G11C 29/00; G11C 29/02; G11C 29/42; G11C 29/50016; G11C 29/04; G11C 29/808; G11C 2029/0411

USPC ............... 365/189.11, 200, 201, 185.095; 714/763–764

See application file for complete search history.

(56) References Cited

U.S. PATENT DOCUMENTS

| 7,496,811 | B2 | 2/2009 | Kanno |
| 9,047,938 | B2 * | 6/2015 | Farooq .............. G11C 13/0004 |
| 2007/0064326 | A1 | 3/2007 | Kanno |
| 2009/0287878 | A1 | 11/2009 | Yamamoto et al. |
| 2010/0235715 | A1 | 9/2010 | Thatcher et al. |
| 2013/0145079 | A1 * | 6/2013 | Lee ..................... G06F 12/0246 |
| | | | 711/103 |
| 2013/0246688 | A1 | 9/2013 | Kanno et al. |

FOREIGN PATENT DOCUMENTS

| JP | 2010-067284 A | 3/2010 |
| JP | 2012-226575 A | 11/2012 |
| JP | 2013-025821 A | 2/2013 |
| JP | 2013-191174 A | 9/2013 |
| JP | 2014-032679 A | 2/2014 |

* cited by examiner

*Primary Examiner* — David Lam
(74) *Attorney, Agent, or Firm* — White & Case LLP (57) ABSTRACT

According to one embodiment, a memory system comprises a first nonvolatile semiconductor memory, a temperature sensor and a controller. The first nonvolatile semiconductor memory includes the first and second semiconductor chips. The temperature sensor detects a temperature of the first nonvolatile semiconductor memory. The controller acquires the wear level per block of the first and second semiconductor chips based on the temperature of the first nonvolatile semiconductor memory and the frequency of use of the first nonvolatile semiconductor memory, and sets, based on the wear level, an examination frequency for defining a cycle of examination of quality of data per block of the first and second semiconductor chips.

14 Claims, 6 Drawing Sheets

| Number of writes | Surface temperature of substrate | Access frequency | Access speed | Program voltage |
|---|---|---|---|---|
| N1 | T1 | F1 | V1 | VT1 |
| N2 | T2 | F2 | V2 | VT2 |
| N3 | T3 | F3 | V3 | VT3 |
| ⋮ | ⋮ | ⋮ | ⋮ | ⋮ |

FIG. 3

| | 0<NR≤A | A<NR≤B | B<NR≤C | C<NR≤D |
|---|---|---|---|---|
| 70°C<T | 1 | 1 | 1 | 1 |
| 60°C<T≤70°C | 1 | 1 | 1 | 1 |
| 50°C<T≤60°C | 2 | 1 | 1 | 1 |
| 40°C<T≤50°C | 5 | 3 | 2 | 1 |
| 30°C<T≤40°C | 15 | 9 | 6 | 2 |
| 20°C<T≤30°C | 50 | 30 | 20 | 3 |
| 10°C<T≤20°C | 180 | 115 | 75 | 10 |
| 0°C<T≤10°C | 700 | 450 | 300 | 37 |
| T≤0°C | 3200 | 2100 | 1300 | 165 |

| Parameter of operation log | Value of parameter |
|---|---|
| Substrate temperature | $T_1, T_2 \cdots T_n$ |
| Number of writes | $N_1, N_2 \cdots N_n$ |
| Access frequency | $F_1, F_2 \cdots F_n$ |
| Access speed | $V_1, V_2 \cdots V_n$ |
| Program voltage | $VP_1, VP_2 \cdots VP_n$ |
| ⋮ | ⋮ |

FIG. 6

| Physical block address | Number of writes | |
|---|---|---|
| AD1 | N1 | ⎫ TBL1 |
| ∫ | ∫ | |
| ADn | N2>N1 | ⎬ 31-1 |
| AD1 | N3>N2 | |
| ∫ | ∫ | ⎬ 31-2 |
| ADn | N4>N3 | |
| AD1 | N1 | |
| ⋮ | ⋮ | |
| ADn | N1 | ⎬ 31-n |

FIG. 7

| Physical block address | Frequency of patrol processing | |
|---|---|---|
| AD1 | 5 | ⎫ TBL2 |
| ∫ | ∫ | |
| ADn | 3 | ⎬ 31-1 |
| AD1 | 2 | |
| ∫ | ∫ | ⎬ 31-2 |
| ADn | 1 | |
| AD1 | 5 | |
| ⋮ | ⋮ | |
| ADn | 5 | ⎬ 31-n |

MEMORY SYSTEM AND MANAGEMENT METHOD THEREOF

CROSS-REFERENCE TO RELATED APPLICATIONS

This application claims the benefit of U.S. Provisional Application No. 62/046,535, filed Sep. 5, 2014, the entire contents of which are incorporated herein by reference.

FIELD

Embodiments described herein relate generally to a memory system using, for example, a semiconductor memory, and a management method thereof.

BACKGROUND

A memory system using a semiconductor memory such as a solid-state drive (SSD) has been developed. In this memory system, the data retention capability of a NAND flash memory mounted on the SSD may decrease with elapsed time.

DETAILED DESCRIPTION

In general, according to one embodiment, a memory system comprises a first nonvolatile semiconductor memory, a temperature sensor and a controller. The first nonvolatile semiconductor memory includes first and second semiconductor chips. The temperature sensor detects a temperature of the first nonvolatile semiconductor memory. The controller acquires the wear level per block of the first and second semiconductor chips based on the temperature of the first nonvolatile semiconductor memory and the frequency of use of the first nonvolatile semiconductor memory, and sets, based on the wear level, an examination frequency for defining a cycle of examination of quality of data per block of the first and second semiconductor chips.

Embodiments

Various embodiments will be described hereinafter with reference to the accompanying drawings. In the drawings, the same portions are represented by the same reference numbers and their descriptions are omitted.

In a NAND flash memory, a memory cell storing data becomes worn as time passes. As the wear progresses, there is a possibility that the data retention of the memory cell will decrease and the stored data cannot be correctly read. If the read data is erroneous, correct data can be restored by executing error correction processing using an error correction code (ECC). However, the data stored in the NAND flash memory will still be erroneous. Furthermore, if the read data error is beyond the capability of the error correction processing, the correct data cannot be restored. Therefore, patrol processing for regularly examining quality of data stored in the NAND flash memory is executed.

In the patrol processing, the data in the NAND flash memory is read, for example, per block, and subjected to quality examination. That is, whether data read from a block is erroneous is examined. As a result, if the data is erroneous, the error correction processing is executed. In such a case where the number of erroneous data elements exceeds a reference value, it is considered that quality of the data of the block has decreased. The data of the block having decreased quality is rewritten to another block and refreshed.

The patrol processing is executed based on a wear level of the memory cell, specifically a wear level of a NAND chip including the NAND flash memory. Here, the wear level means the degree which data cannot write appropriately in a memory cell included in a physical block of the NAND chip. The wear level of the NAND chip differs according to, for example, a temperature of a substrate on which the NAND chip is mounted and the number of writes of the NAND chip. It should be noted that the temperature of the substrate can be regarded as a temperature of the NAND chip since this temperature is nearly equal to a temperature of a package accommodating the NAND chip. Specifically, the wear level of the NAND chip is defined by, for example, the temperature of the substrate, the number of writes of the NAND chip or the number of erases of the NAND chip as described later. Therefore, a patrol management table for managing execution of the patrol processing is preliminarily prepared, and the patrol processing is executed in accordance with contents of the patrol management table.

The patrol management table defines the relationship between the wear level of the NAND chip and the frequency (hereinafter referred to as the frequency of the patrol processing or the examination frequency) specifying an execution cycle of the patrol processing. More specifically, the frequency of the patrol processing is set in accordance with a temperature range of the substrate on which the NAND chip is mounted and a range of the number of writes. The execution cycle of the patrol processing is represented by a standard cycle multiplied by a frequency. As the frequency becomes lower, the execution cycle of the patrol processing becomes shorter. That is, the number of repetition of the patrol processing is increased, and the number of execution of the patrol processing within a certain time is also increased.

The frequency of the patrol processing set in the patrol management table is set to a preliminarily estimated value. Therefore, the value is not dynamically changed in accordance with current values of the wear level of the memory cell and the temperature of the substrate, and is not necessarily set to an optimum value. Since the patrol processing is executed in the background of user data processing, the patrol processing is not recognized by the user. If the frequency of the patrol processing set in the patrol management table does not correspond to the wear level of the memory cell and the patrol processing is frequently executed, the patrol processing can become obvious.

Figure 1:
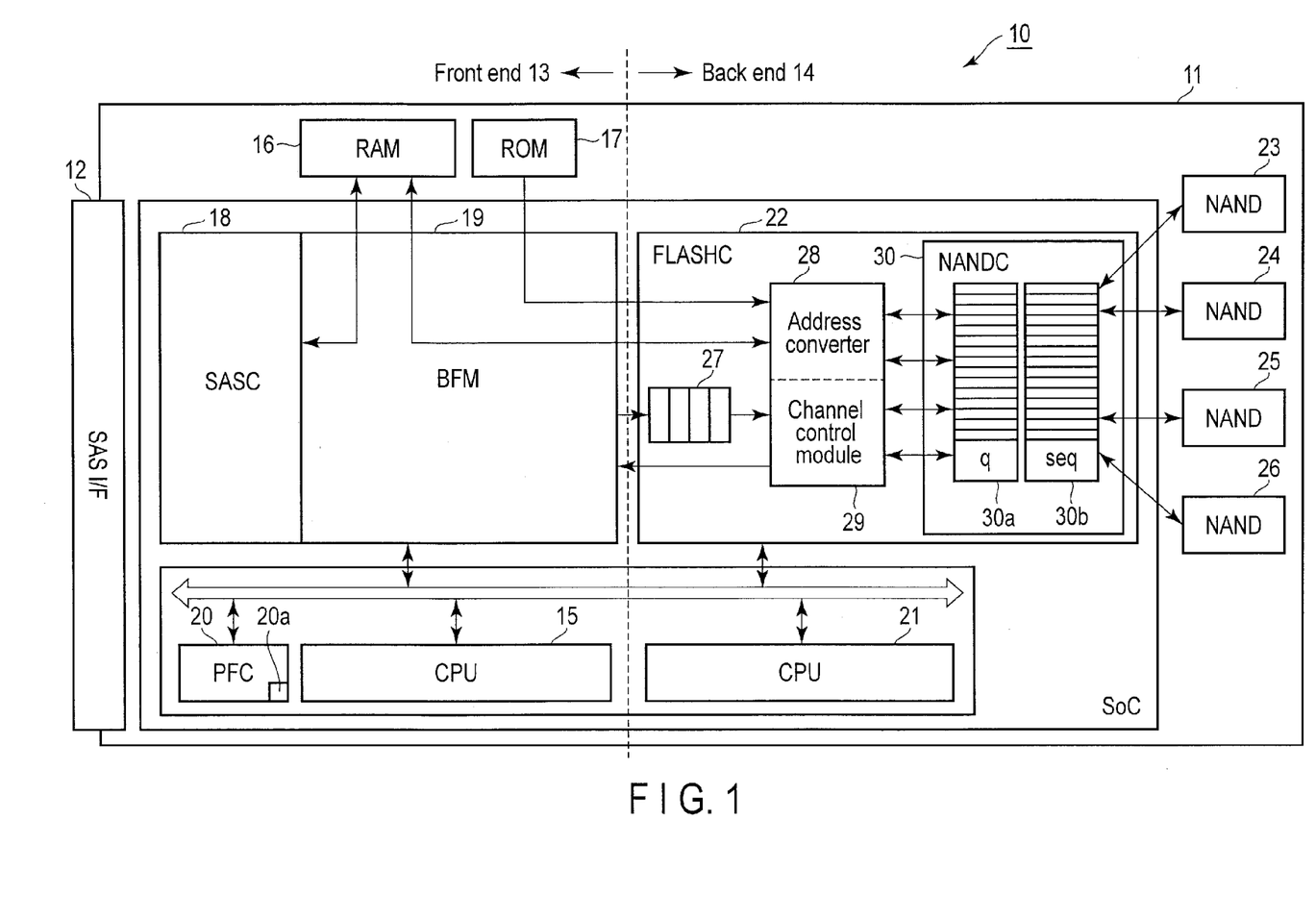
FIG. 1 is a schematic configuration diagram showing an example of a memory system to which a present embodiment is applied.

FIG. 1 shows an example of an SSD module 10 serving as a memory system to which the present embodiment is applied. However, the SSD module 10 is not limited to this configuration.

The SSD module 10 includes, for example, a serial attached SCSI (SAS) interface (SASI/F) 12 provided on a substrate 11, a front end 13 and a back end 14. The SSD module 10 is connected to a superior controller (not shown, hereinafter referred to as a host) such as a server via the SASI/F 12, and functions as an external memory.

The front end 13 receives commands and data from the host and transmits data to the host via the SASI/F 12. The front end 13 includes a CPU 15, a DRAM 16 serving as a volatile memory, a ROM 17 serving as a nonvolatile memory, an SAS controller (SASC) 18, a buffer manager 19, and a peripheral circuit (PFC) 20.

The front end 13 processes a command supplied from the host. That is, the front end 13 receives a command from the host via the SAS controller 18 and, if a kind of the command is a request to read data or a request to write data, transfers the command to the back end 14. The CPU 15 of the front end 13 controls the buffer manager 19 and the DRAM 16 serving as a write buffer and a read buffer in cooperation with a CPU 21 of the back end 14, and transfers data between the host and the DRAM 16, and between the DRAM 16 and the back end 14. Such a function of the front end 13 is implemented by software (firmware) executed on the CPU 15.

Furthermore, the ROM 17 stores values of an operation management table for managing various operations of NANDs 23 to 26. The values of the operation management table are read from the ROM 17, supplied to the back end 14 and control operations of each of the NANDs 23 to 26.

The peripheral circuit 20 includes a temperature sensor 20a constituted by, for example, a thermocouple which detects a temperature of, for example, a control circuit of a power source and the substrate 11. Since the temperature detected by the temperature sensor 20a is nearly equal to a temperature of a package of each of the NANDs 23 to 26 accommodating a plurality of NAND chips, this temperature can be regarded as a temperature of the NAND chips.

The back end 14 includes, for example, the CPU 21, a flash controller 22 and the plurality of NANDs 23 to 26. The flash controller 22 includes a command queue 27 which holds various commands supplied from the front end 13, an address converter 28 to convert logical addresses into physical addresses, a channel (ch) control module 29 which assigns commands and data to each of the NANDs 23 to 26, and a NAND controller (NANDC) 30 which controls operations of the NANDs 23 to 26. The NAND controller 30 includes, for example, a command queue (q) 30a and a sequencer (seq) 30b.

The channel control module 29 assigns commands from the command queue 27 to the command queue 30a corresponding to the NANDs 23 to 26 in accordance with addresses. The NAND controller 30 converts commands in the command queue 30a into commands for the NANDs 23 to 26. The sequencer 30b controls operations of the plurality of NANDs 23 to 26 in accordance with the converted commands.

The above-described functions of the back end 14 are implemented by firmware executed on the CPU 21.

(Configuration in NAND Package)

Figure 2:
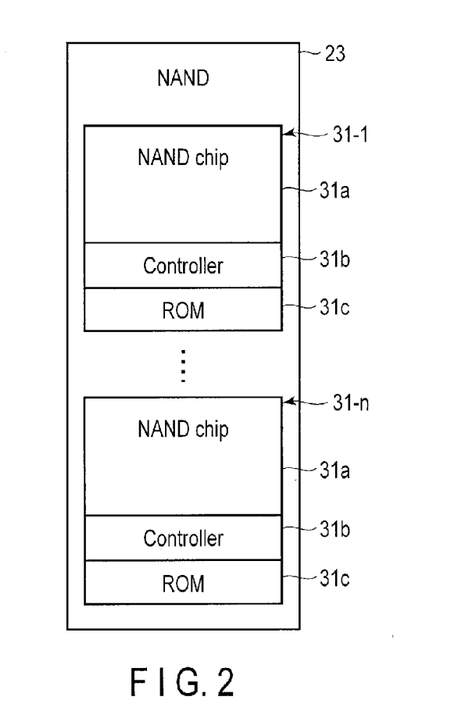
FIG. 2 is a schematic configuration diagram showing an example of a NAND flash memory shown in FIG. 1.

FIG. 2 shows an example of the NANDs 23 to 26. Since the NANDs 23 to 26 have the same configuration, the NAND 23 is hereinafter described. The NAND 23 includes, for example, a plurality of NAND flash memory chips (hereinafter referred to as NAND chips or semiconductor chips) 31-1 to 31-n. Each of the NAND chips 31-1 to 31-n comprises a memory cell array 31a, a controller 31b, and a writable ROM 31c. The ROM 31c may be a part of an area of the memory cell array 31a, and holds, for example, the latest operation management table and an operation log of the corresponding NAND chip. The "operation log" is an operation history of each process in the NAND chip. In the ROM 31c, information of respective operation histories corresponding to respective parameters in the operation management table is updated whenever the NAND chip is used.

The controller 31b controls operations such as writes, reads and erases of the memory cell array 31a in accordance with a command supplied from the sequencer 30a and values of parameters in the operation management table.

(Operation Management Table)

Figure 3:
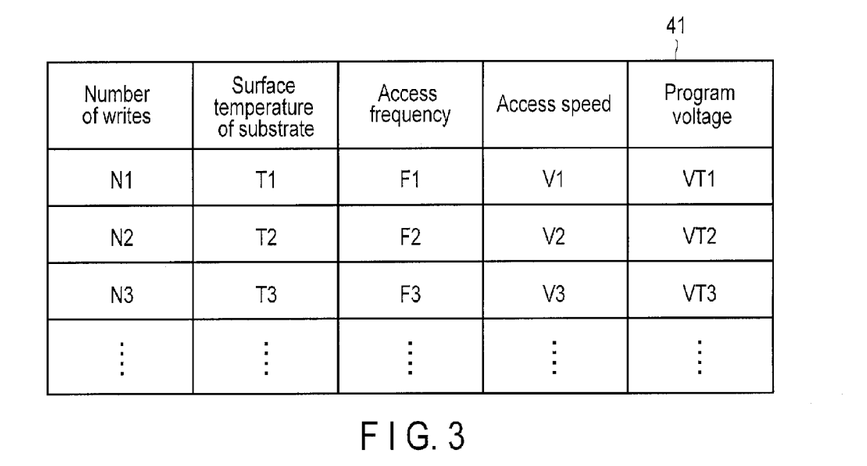
FIG. 3 is a schematic diagram showing an example of an operation management table.

FIG. 3 shows an example of the operation management table stored in the ROM 17 of the front end 13 or the ROM 31c of each of the NAND chips 31-1 to 31-n. The operation management table 41 manages various types of parameters which influence performance and operations of the NAND flash memory, for example, values of the set number of writes, the temperature, i.e., the set temperature of the substrate 11 on which the NANDs 23 to 26 are arranged (a temperature detected by the temperature sensor 20a), a set access frequency, a set access speed, and a set program voltage. A parameter set shown in FIG. 3 is an example and, for example, the number of erases, a loop count, the number of reads, a breaking time, etc., can be applied.

The term "set" means a recommended value set to suitably operate each of the NAND chips. In the SSD module 10 of the present embodiment, management is executed to avoid a malfunction of the NAND chips caused by deviation from these values and an excessive load on the NAND chips by referring to each parameter when the NAND chips are operated.

The specific values are given as examples. However, they are not limited to the specific values. For example, if the values can function as parameters to suitably operate each of the NAND chips, a recommended range including an upper limit and a lower limit may be set.

The operation management table 41 stored in the ROM 17 of the front end 13 contains default values necessary for operations of the NANDs 23 to 26. The operation management table shows, for example, a plurality of parameter values $(N_1, N_2 \ldots, T_1, T_2 \ldots, F_1, F_2 \ldots, V_1, V_2 \ldots, VT_1, VT_2 \ldots)$ corresponding to the plurality of chips included in the NANDs 23 to 26, respectively. The operation management table is not limited to this, but may be a single operation management table common to the plurality of chips included in the NANDs 23 to 26.

In the initial state, the operation management table supplied from the ROM 17 of the front end 13 is stored in the ROM 31c of each of the NAND chips 31-1 to 31-n, and each of the NAND chips 31-1 to 31-n is operated in accordance with the operation management table stored in the corresponding ROM 31c.

(Patrol Management Table)

Figure 4:
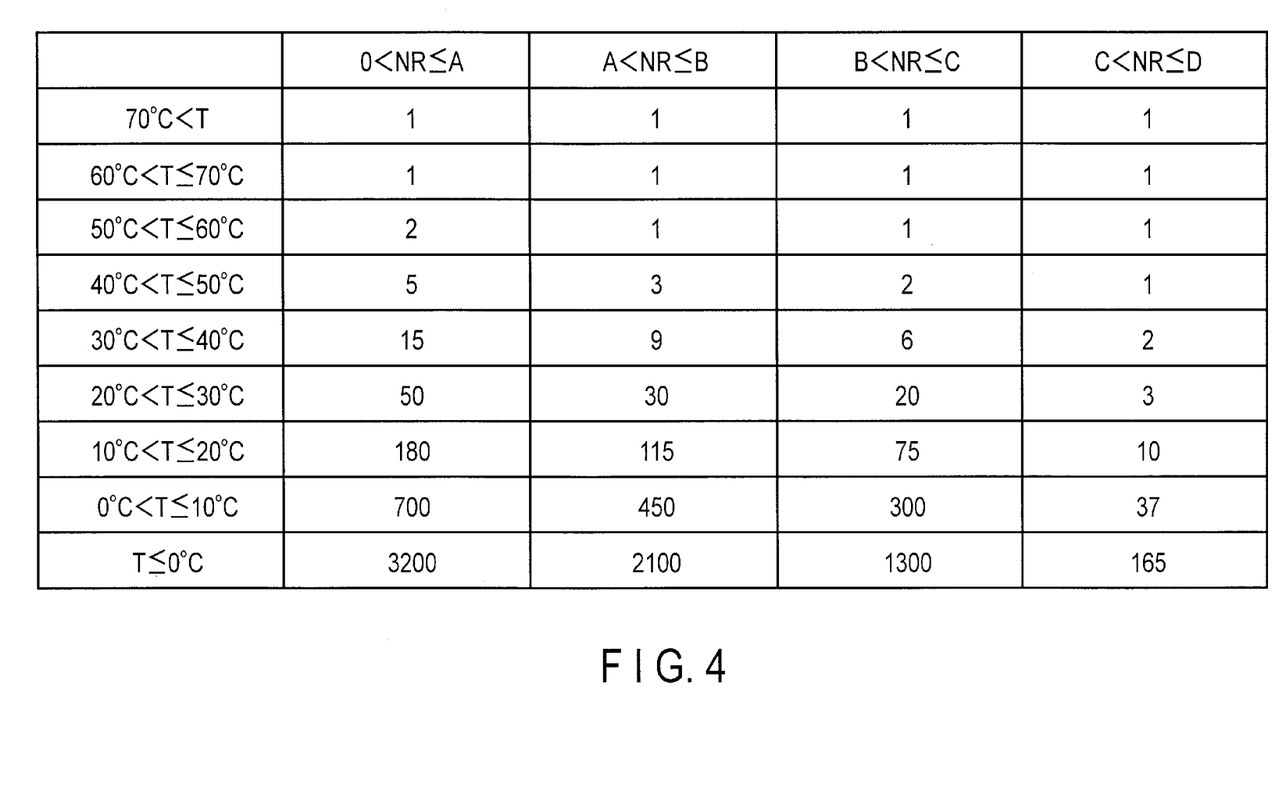
FIG. 4 is a diagram showing an example of a patrol management table.

FIG. 4 shows an example of the patrol management table. As described above, the frequency of the patrol processing is set in the patrol management table in accordance with the temperature range and the range NR of the number of writes in FIG. 4. FIG. 4 shows the frequency of the patrol processing according to the temperature range and the range NR of the number of writes as an example, but the parameter is not limited to the range NR of the number of writes. Another parameter indicating the frequency of use the NAND chips such as a range of the number of erases can be also used. That is, the frequency of use means a frequency of access of the NAND chips, and includes the number of writes and the number of erases, etc.

As described above, the execution cycle of the patrol processing is represented by the standard cycle multiplied by the frequency. If the standard cycle is, for example, ten hours, the execution cycle is represented by ten hours multiplied by the frequency. In FIG. 4, when the range of the number of writes is "$0 < NR \le A$" and the temperature range is "60° C.$<T \le 70°$ C.", the frequency is "1". Therefore, the execution cycle is 10 hours×1=10 hours. That is, the patrol processing is executed every ten hours. When the range of the number of writes is "$0 < NR \le A$" and the temperature range is "30° C.$<T \le 40°$ C.", the frequency is "15". Therefore, the execution cycle is ten hours×15=150 hours, and the patrol processing is executed every 150 hours. Thus, the frequency of the patrol processing is set to be lower as the temperature becomes higher and the number of writes increases. Therefore, the execution cycle becomes short and the patrol processing is frequently executed. However, the frequency set in the patrol management table is fixed and does not necessarily correspond to the wear level of each NAND chip.

(Update Operation of Patrol Management Table Per Physical Block)

Therefore, in the present embodiment, management is executed to update the frequency of the patrol processing in accordance with the wear level of the NAND chips. More specifically, management is executed to update the frequency of the patrol processing, for example, per physical block of the NAND chips. However, it is not limited to managing per the physical block as an erase unit, but the frequency of the patrol processing may be managed in chips, NAND packages, mounting regions thereof, or a unit smaller than the block.

Figure 5:
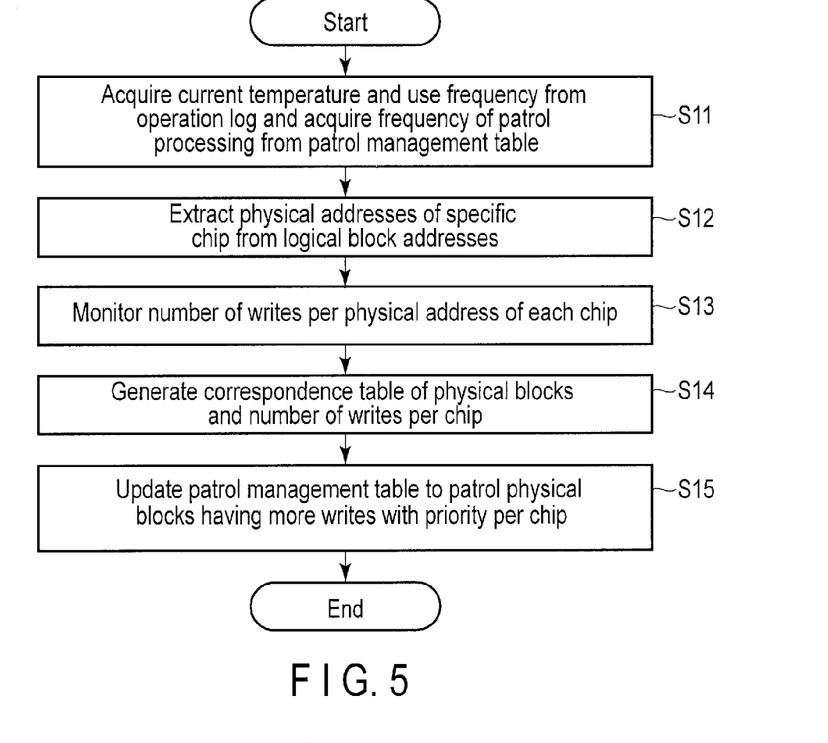
FIG. 5 is a flowchart showing an operation for generating the patrol management table in the present embodiment.

FIG. 5 shows a generating operation of the patrol management table in the present embodiment. This operation is implemented by, for example, firmware executed by the CPU 21 of the back end 14. However, the implementation is not limited to this. The operation can be also implemented by, for example, a hardware circuit, incorporated management software, an external command, etc.

First, a current temperature of the substrate and the number of writes are acquired from the operation log of each of the NAND chips 31-1 to 31-n, and the frequencies of the patrol processing corresponding to the current temperature and the number of writes, respectively, are acquired from the patrol management table shown in FIG. 4 (S11).

Figure 6:
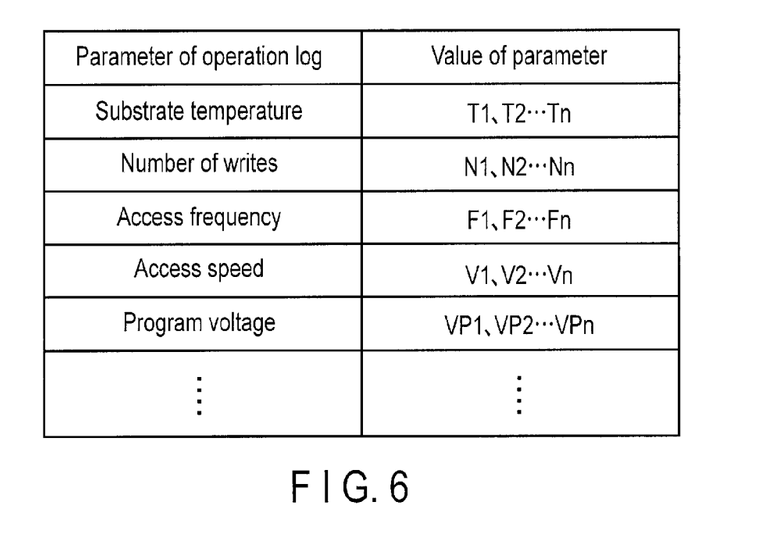
FIG. 6 is a diagram showing an example of an operation log of a NAND chip.

FIG. 6 shows an example of the operation log of each of the NAND chips 31-1 to 31-n. The operation log includes, for example, the temperature of the substrate, the number of writes, the access frequency, the access speed, the program voltage, etc., similarly to the parameters of the operation management table shown in FIG. 3. That is, the operation log of each of the NAND chips 31-1 to 31-n includes the temperature of the substrate detected by the temperature sensor 21a, i.e., the temperature of each of the NAND chips 31-1 to 31-n, the number of writes of each of the NAND chips 31-1 to 31-n, etc., and the CPU 21 acquires the temperature of the substrate and the number of writes from the operation log of each of the NAND chips 31-1 to 31-n.

The patrol management table shown in FIG. 4 is stored in, for example, the ROM 17 of the front end 13. The CPU 21 reads, from the patrol management table stored in the ROM 17, the frequencies of the patrol processing corresponding to the current temperature of the substrate and the number of writes, respectively, acquired from the operation log of each of the NAND chips 31-1 to 31-n. For example, when the temperature of the substrate acquired from the operation log is 45° C. and the number NR of writes is "$0 < NR \le A$", "5" is acquired from the patrol management table shown in FIG. 4 as the frequency of the patrol processing.

Next, physical block addresses of the NAND chips 31-1 to 31-n included in each of the NANDs 23 to 26 are acquired from an address conversion table for converting logical block addresses and physical block addresses of the NANDs 23 to 26 held in the address converter 28 (S12).

That is, the address conversion table is usually stored in the memory cell array 31a of each of the NAND chips 31-1 to 31-n, read from the memory cell array 31a on the activation of the device, and held in the address converter 28 of the back end 14. The contents of the address conversion table held in the address converter 28 are updated by write of data or execution of garbage collection. The updated address conversion table is sequentially stored in the memory cell array 31a of each of the NAND chips 31-1 to 31-n. Therefore, the latest address conversion table is held in the address converter 28. The physical block addresses of each of the NAND chips 31-1 to 31-n in each of the NANDs 23 to 26 are acquired from the latest address conversion table.

Next, the wear level of each of the NAND chips 31-1 to 31-n included in each of the NANDs 23 to 26 is monitored (S13). More specifically, for example, the number of writes is monitored per physical block included in each of the NAND chips 31-1 to 31-n by the CPU 21 of the back end 14. For example, the number of write commands in the commands supplied from the command queue 27 to the channel control module 29 by the CPU 21 is counted as the number of writes. The CPU 21 searches the physical block addresses from logical block addresses appended to the write commands based on the address conversion table held in the address converter 28.

Then, a wear level table (first table) TBL 1 for managing the counted number of writes is generated in accordance with the physical block addresses thus acquired by the CPU 21 (S14).

Figure 7:
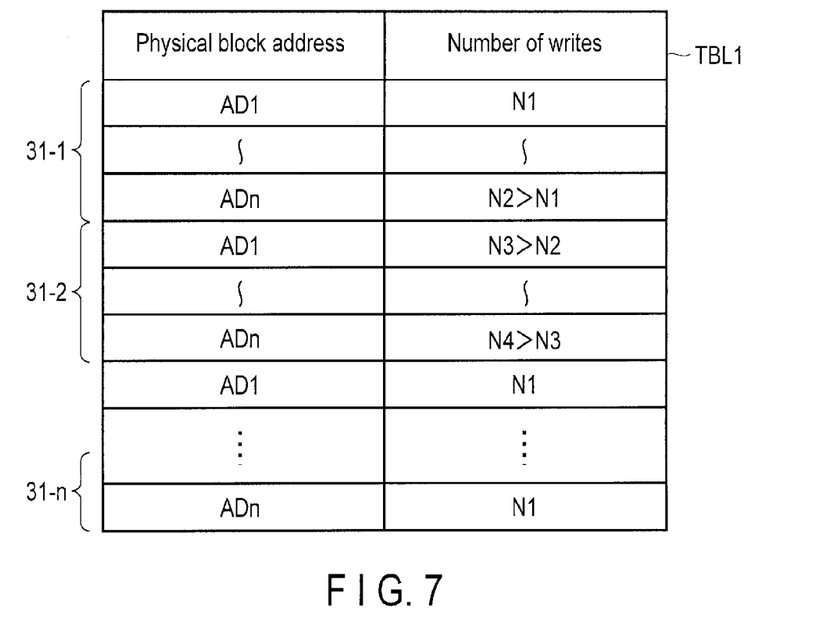
FIG. 7 is a diagram showing an example of a first table for managing the number of writes per physical block address.

FIG. 7 shows an example of the first table TBL 1 for managing the number of writes per physical block address. As shown in FIG. 7, the number of writes differs according to physical block addresses AD1 to ADn of each of the NAND chips 31-1 to 31-n. There are blocks having many writes and blocks having few writes. The blocks frequently accessed and the blocks infrequently accessed can be thereby distinguished, and the wear level per block can be determined.

Next, in order to minimize the wear level of the first table TBL 1, the patrol management table is updated to execute the patrol processing for the physical blocks having many writes, i.e., the physical blocks having the high wear level, with priority (S15).

Figure 8:
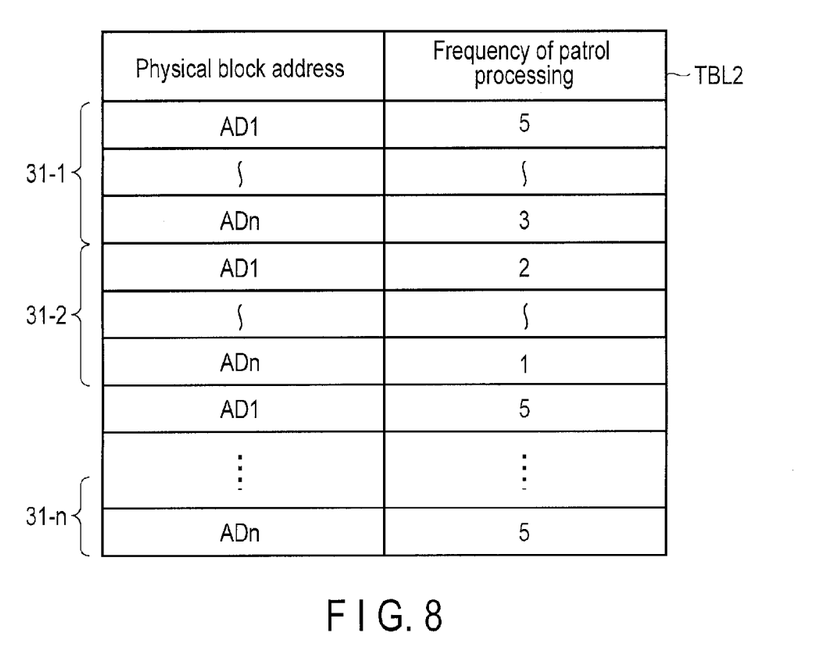
FIG. 8 is a diagram showing an example of a second table serving as the patrol management table of the present embodiment.

FIG. 8 shows an example of the patrol management table (second table) TBL 2 of the present embodiment. In the second table TBL 2, the frequencies of the patrol processing are managed in accordance with the physical block addresses. More specifically, when the number N1 of writes of the physical block address AD1 of the NAND chip 31-1 in the first table TBL 1 falls within the range "$0 < NR \le A$" shown in FIG. 4, the frequency "5" of the patrol processing acquired in step S11 is extracted. The extracted frequency "5" of the patrol processing is set to correspond to the physical block address AD1 of the NAND chip 31-1 in the second table TBL 2.

Similarly, when the number N4 of writes of the physical block address ADn of the NAND chip 31-2 in the first table TBL 1 falls within the range "$0 < NR \le D$" shown in FIG. 3, "1"

is set as the frequency of the patrol processing corresponding to the physical block address ADn of the NAND chip 31-2 in the second table TBL 2.

In the present embodiment, the frequency of the patrol processing is set in the second table TBL 2 in accordance with the number of writes of each physical block of each chip monitored in steps S12 and S13. That is, in the first table TBL 1, a physical block having many writes is worn more than a physical block having few writes. For this reason, a small value is set in the second table TBL 2 as the frequency of the patrol processing such that patrol is executed with priority. Accordingly, the execution cycle of the patrol processing becomes shorter and the patrol processing is executed with priority.

In contrast, in the physical block having few writes, the wear level of the memory cell is lower than that of the physical block having many writes. For this reason, a large value is set as the frequency of the patrol processing in the physical block having few writes as compared with the physical block having many writes. Accordingly, the execution cycle of the patrol processing becomes longer.

As described above, the patrol processing is executed by using the second table TBL 2 in which the frequency of the patrol processing corresponding to each physical block address is updated in accordance with the number of writes corresponding to each physical block address. That is, a physical block having the low frequency of the patrol processing is subjected to the patrol processing with higher priority than a physical block having the high frequency of the patrol processing. In other words, a physical block for which "1" is set as the frequency of the patrol processing has a higher priority than a physical block for which "5" is set as the frequency of the patrol processing, and is frequently patrolled. In contrast, the physical block for which "5" is set as the frequency of the patrol processing has a lower priority than the physical block for which "1" is set as the frequency of the patrol processing, and is subjected to the patrol processing at an interval five times longer than that of the physical block for which "1" is set as the frequency of the patrol processing.

Figure 9:
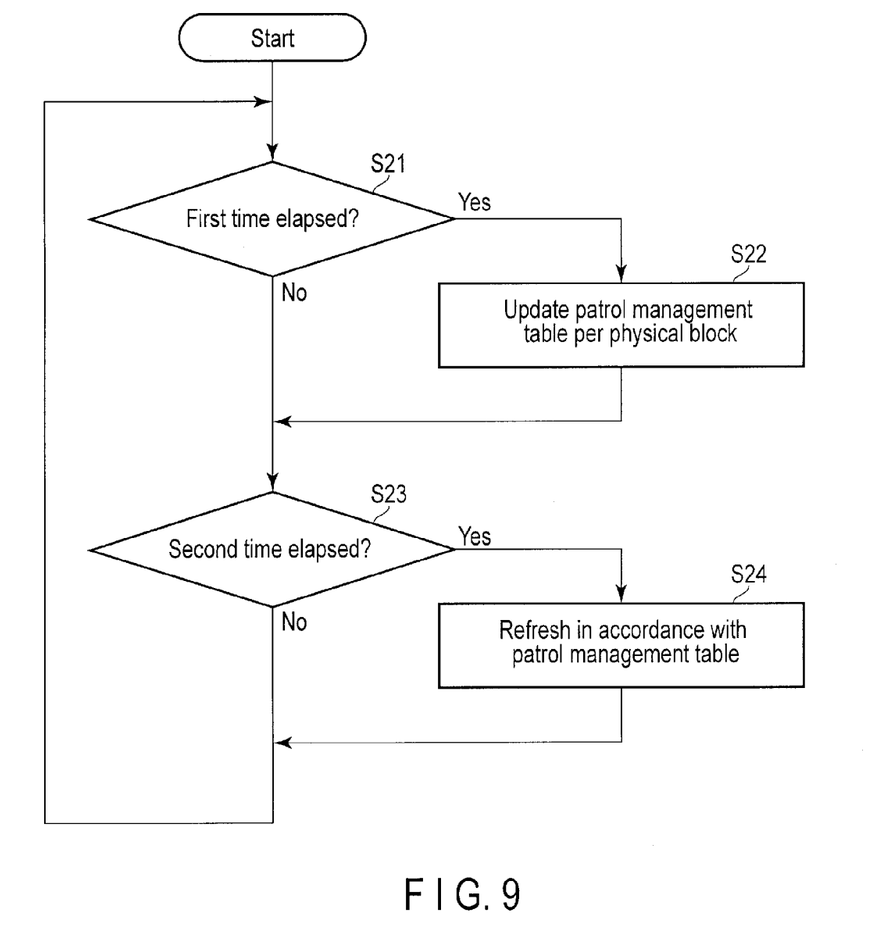
FIG. 9 is a schematic flowchart showing the relationship between an update operation of the patrol management table and a patrol operation in the present embodiment.

FIG. 9 shows the relationship between the update operation of the patrol management table per physical block and the execution of the patrol processing.

The patrol processing can be executed based on the latest patrol management table (second table) TBL 2 by executing the update operation of the patrol management table shown in FIG. 5, for example, in a cycle shorter than the standard cycle of the patrol processing.

More specifically, as shown in FIG. 9, it is first determined by the CPU 21 of the back end 14 whether a first time shorter than the standard cycle of the patrol processing has elapsed (S21). As a result, if the first time has elapsed, the update operation of the second table TBL 2 shown in FIG. 5 is executed (S22).

If the first time has not elapsed in step S21, and after the update operation of the second table TBL 2 is executed in step S22, it is determined whether a second time longer than the first time has elapsed (S23). As a result, if the second time has elapsed, the patrol processing is executed based on the second table TBL 2 updated in step S22 (S24).

If the second time has not elapsed in step S23, and after the patrol processing is executed in step S24, the control returns to step S21 and the above-described operation is repeated.

According to the above-described embodiment, the first table TBL 1 indicating the number of writes per physical block address of each of the NAND chips 31-1 to 31-*n* is generated, the wear level per physical block address of each of the NAND chips 31-1 to 31-*n* is detected, the second table TBL 2 for managing the frequency of the patrol processing based on the first table TBL 1 in order to minimize the wear level, and the patrol processing is executed based on the second table TBL 2. For this reason, the most suitable frequency of the patrol processing can be dynamically set in accordance with the wear level per physical block address of each of the NAND chips 31-1 to 31-*n*. Therefore, the wear level of each of the NAND chips 31-1 to 31-*n* can be kept to the minimum, and performance of each of the NAND chips 31-1 to 31-*n* can be maintained.

Furthermore, since unnecessary patrol processing can be eliminated, the influence on the user data processing can be reduced.

It should be noted that the address converter 28 which converts logical addresses into physical addresses may be constituted by using an address transfer table or a B-Tree structure. Moreover, the operation management table and the patrol management table are constituted by tables. However, these tables are not limited to tables, and may be also constituted by the B-Tree structure, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a first nonvolatile semiconductor memory including first and second semiconductor chips;
   a temperature sensor configured to detect a temperature of the first nonvolatile semiconductor memory; and
   a controller configured to control an operation of the first nonvolatile semiconductor memory,
   wherein the controller acquires a wear level per block of the first and second semiconductor chips based on the temperature of the first nonvolatile semiconductor memory and a frequency of use of the first nonvolatile semiconductor memory, and sets, based on the wear level, an examination frequency for defining a cycle of examination of quality of data per block of the first and second semiconductor chips.

2. The system according to claim 1, further comprising
   a second nonvolatile semiconductor memory configured to store a management table in which the examination frequency for defining a cycle of examination of quality of data stored in the first nonvolatile semiconductor memory is set in accordance with the temperature and the frequency of use of the first nonvolatile semiconductor memory.

3. The system according to claim 2, wherein
   the controller acquires the temperature and the frequency of use from an operation log of the first and second semiconductor chips, acquires the examination frequency from the management table based on the acquired temperature and the frequency of use, acquires block addresses from logical block addresses of the first and second semiconductor chips, generates a first table indicating a relationship between the physical addresses and the frequency of use per semiconductor chip, and generates a second table managing a frequency of examination corresponding to the block address based on the frequency of use in the first table and the examination frequency.

4. The system according to claim 3, wherein the cycle of examination is represented by a standard cycle multiplied by the examination frequency.

5. The system according to claim 4, wherein the controller updates the second table in a cycle shorter than the standard cycle.

6. A memory system comprising:
a first nonvolatile semiconductor memory including first and second semiconductor chips;
a temperature sensor configured to detect a temperature of the first nonvolatile semiconductor memory;
a second nonvolatile semiconductor memory configured to store a management table, an examination frequency for defining a cycle of examination of quality of data stored in the first nonvolatile semiconductor memory being set in the management table in accordance with the temperature and the frequency of use of the first nonvolatile semiconductor memory; and
a controller configured to control an operation of the first nonvolatile semiconductor memory,
wherein the controller acquires the temperature and the frequency of use from an operation log of the first and second semiconductor chips, acquiring the examination frequency from the management table based on the acquired temperature and the frequency of use, acquires block addresses from logical block addresses of the first and second semiconductor chips, generates a first table indicating a relationship between the physical addresses and the frequency of use per semiconductor chip, and generates a second table managing a frequency of examination corresponding to the block address based on the frequency of use in the first table and the examination frequency.

7. The system according to claim 6, wherein the cycle of examination is represented by a standard cycle multiplied by the examination frequency.

8. The system according to claim 7, wherein the controller updates the second table in a cycle shorter than the standard cycle.

9. A management method of a memory system, the method comprising:
acquiring a wear level per block of first and second semiconductor chips included in the nonvolatile semiconductor memory based on a temperature of a nonvolatile semiconductor memory and a frequency of use of the nonvolatile semiconductor memory; and
setting an examination frequency for defining a cycle of examination of quality of data per block of the first and second semiconductor chips based on the wear level.

10. The method according to claim 9, wherein the temperature and the frequency of use are acquired from an operation log of each of the semiconductor chips.

11. The method according to claim 10, further comprising acquiring, based on the temperature and the frequency of use, the examination frequency from a management table in which the examination frequency for defining the cycle of examination of quality of data stored in the nonvolatile semiconductor memory is set in accordance with the temperature and the frequency of use of the nonvolatile semiconductor memory.

12. The method according to claim 11, further comprising:
acquiring block addresses from logical block addresses of the first and second semiconductor chips;
generating a first table indicating a relationship between the physical addresses and the frequency of use per semiconductor chip; and
generating a second table managing the frequency of examination corresponding to the block address based on the frequency of use in the first table and the examination frequency.

13. The method according to claim 12, wherein the cycle of examination is represented by a standard cycle multiplied by the examination frequency.

14. The method according to claim 13, wherein the second table is updated in a cycle shorter than the standard cycle.

* * * * *